(12) United States Patent
Tredwell et al.

(10) Patent No.: US 7,968,358 B2
(45) Date of Patent: Jun. 28, 2011

(54) DIGITAL RADIOGRAPHIC FLAT-PANEL IMAGING ARRAY WITH DUAL HEIGHT SEMICONDUCTOR AND METHOD OF MAKING SAME

(75) Inventors: Timothy J. Tredwell, Fairport, NY (US); Jackson Lai, Rochester, NY (US)

(73) Assignee: Carestream Health, Inc., Rochester, NY (US)

( * ) Notice: Subject to any disclaimer, the term of this patent is extended or adjusted under 35 U.S.C. 154(b) by 58 days.

(21) Appl. No.: 12/511,119

(22) Filed: Jul. 29, 2009

(65) Prior Publication Data

US 2011/0024774 A1 Feb. 3, 2011

(51) Int. Cl.
 *H01L 21/00* (2006.01)
(52) U.S. Cl. ............................. 438/34; 257/93
(58) Field of Classification Search ...... 438/34
 See application file for complete search history.

(56) References Cited

U.S. PATENT DOCUMENTS

| | | | |
|---|---|---|---|
| 7,176,528 B2 | 2/2007 | Couillard et al. | |
| 7,192,844 B2 | 3/2007 | Couillard et al. | |
| 7,268,051 B2 | 9/2007 | Couillard et al. | |
| 2009/0186464 A1 * | 7/2009 | Morimoto et al. | 438/459 |

OTHER PUBLICATIONS

Tredwell et al., "Imaging Array With Dual Height Semiconductor and Method of Making Same," U.S. Appl. No. 12/474,332, filed May 29, 2009.

* cited by examiner

*Primary Examiner* — Quoc D Hoang
*Assistant Examiner* — Tony Tran

(57) ABSTRACT

A method of manufacturing an imaging array includes providing a silicon tile having a first surface and a second, opposite surface. A buried dielectric layer is formed in the silicon tile between the first and second surfaces to define a bottom silicon layer between the first surface and the dielectric layer. A separation boundary is formed in the silicon tile between the second surface and the dielectric layer to define a top silicon layer between the dielectric layer and the separation boundary and a removable silicon layer between the separation boundary and the second surface. An oxide layer is formed on the first surface of the silicon tile and the silicon tile is bonded to a glass substrate at the oxide layer. The silicon tile is separated at the separation boundary to remove the removable silicon layer, exposing the top silicon layer. Semiconductive elements are formed using the exposed top silicon layer.

21 Claims, 14 Drawing Sheets

DIGITAL RADIOGRAPHIC FLAT-PANEL IMAGING ARRAY WITH DUAL HEIGHT SEMICONDUCTOR AND METHOD OF MAKING SAME

TECHNICAL FIELD

The present invention relates to imaging apparatuses. More particularly, the present invention relates to a large-area flat-panel imaging apparatus for indirect digital radiography having a dual height semiconductor and methods of fabricating such an imaging apparatus.

DESCRIPTION OF RELATED ART

FIG. 1 shows a conventional 2×2 imaging array 10 containing imaging pixels 12. As illustrated, each imaging pixel 12 includes a photosensitive element 14 and a readout element 15. FIG. 1 shows an active pixel design in which the readout element includes four transistors, namely, a transfer gate 16, a reset transistor 18, a row select transistor 20, and an amplifier transistor 22. More or less transistors could be incorporated into the readout element, as is well known in the art. The photosensitive element 14 of FIG. 1 is a p-n junction photodiode, although it could be any number of photosensitive elements, including, but not limited to MIS photosensors, p-i-n photodiodes, and the like. The transistors are thin-film transistors (TFTs).

As generally is known, when light strikes the array, electron-hole pairs are created at the photosensitive element 14. The holes diffuse through a p-type substrate to a contact. The electrons are held on the photodiode capacitance, and are selectively readout through the transfer gate 16, the amplifier transistor 22, and the row select transistor 20. Following readout, the reset transistor 18 is turned on, resetting the photodiode bias to its original value.

Imaging arrays such as those just described can be fabricated in any number of known ways. FIG. 2 illustrates a cross-section of a pixel fabricated from single crystal silicon wafers. More particularly, FIG. 2 shows a cross section taken through the photodiode 14, transfer gate 16, and amplifier transistor 22 of FIG. 1. In FIG. 2, a p-doped single crystal silicon tile 30 is disposed on a metal contact 32. The p-n junction photodiode is formed by the p-doped substrate (p-side) and an n-dopant region 34 formed by diffusion or ion implant of phosphorous or arsenic n-type dopant (n-side).

Because of the excellent semiconductor device properties of transistors fabricated in single crystal silicon, including high mobility, sharp turn-on characteristics, low leakage currents and availability of both NMOS and PMOS transistors in the same process, single crystal silicon imaging arrays achieve high levels of integration, high speed operation and low noise. For example, present silicon image sensors for digital cameras display noise levels less than 10 rms electrons, quantum efficiency in visible wavelengths of 20%-50%, and readout rates of 20-100 megapixels per second. Additionally, CMOS single-crystal silicon arrays typically integrate all of the addressing and readout circuitry on the same silicon die as the image sensor, allowing a high degree of integration and low overall imaging system cost. However, single crystal silicon arrays typically have length and width dimensions less than 1 cm. Larger area arrays suffer from high cost and low yield, and in any event are limited to the area attainable in a silicon wafer. For large-area imaging applications, such as digital radiography, where detector sizes are typically 17"×17", large-area flat-panel imaging arrays are required. Larger arrays conventionally use amorphous silicon flat-panel fabrication technology.

FIG. 3 illustrates a cross-section of a device in which the photosensitive element 14 and the readout element 15 are formed from a single-thickness amorphous silicon layer. The photosensitive element 14 is an MIS photosensor and the readout element 15 is a single TFT. More transistors also could be included, such as in the pixel circuit of FIG. 1. In fabrication, a first level of metal 42 is deposited on a glass substrate 40. The first level of metal 42 forms both the transistor gate for the readout element 15 and the back contact for the photosensitive element 14. A gate dielectric 44 is disposed on the first level of metal 42 to form both the transistor gate dielectric and the gate dielectric for the photosensor. An undoped layer 46 thereafter is formed on the gate dielectric 44 to form the semiconductor layer for both the photosensitive element 14 and the TFT 15. Heavily doped n-type amorphous silicon 48 forms the source and drain regions of the TFTs and the n-side contact to the MIS photosensor. Another layer of the gate dielectric thereafter preferably is disposed over the n-type amorphous silicon 48, and a second level of metal 50 forms the source and drain contact metallization and the vertical interconnect for the array.

In the prior art array just described, a single amorphous silicon layer forms the semiconductor for both the photosensitive elements and the readout elements. This is a relatively low-cost fabrication method, because it minimizes fabrication steps. However, for most applications the desired thickness of the layer for imaging functions is much larger than the thickness desired for TFTs. That is, an increased thickness is desirable to absorb light, and that thickness preferably is one or more optical absorption depths. A preferred thickness typically is on the order of about one to two microns. However, thin-film-transistors fabricated from semiconductor layers that are relatively thick display significantly higher leakage currents in the off state. A preferable silicon thickness for TFTs is usually on the order of about 100 nm, much smaller than what is preferable for the photosensitive element.

Different silicon thickness for the photosensitive element and for the TFT has been achieved in prior-art amorphous silicon pixel designs by stacking the photosensitive element on top of the TFT. That is, the TFT first is formed on a substrate and once completed, or substantially completed, the photosensitive element is formed by subsequently formed layers. An illustration of a conventional pixel of this type is illustrated in FIG. 4. As shown, the readout element 15 is disposed beneath the photosensitive element 14.

While the vertical or stacked pixel structure of FIG. 4 allows for greater control of the thicknesses of the semiconductor layers for the photosensitive and readout elements, fabrication includes numerous steps and is therefore more expensive. Additionally, the transistor characteristics of amorphous silicon are significantly inferior to those of single crystal silicon, including an electron mobility of about 700 times lower and a hole mobility of greater than 10,000 times lower. As a result, large-area amorphous silicon imaging arrays typically achieve noise levels of more than 3,000 electrons, require extensive external addressing and signal sensing electronics, and are limited in readout speed to rates well below single-crystal silicon arrays.

A substrate that is now being used for large area arrays is Silicon-On-Glass (SiOG), which is a new class of substrate material in which one or more thin silicon regions are attached to a large-area glass substrate. The process is described in U.S. Pat. Nos. 7,176,528, 7,192,844, and 7,268,051 assigned to Corning Inc. All of these patents are hereby incorporated in their entirety by reference. The process generally includes bonding one or more tiles to a glass substrate. To condition the silicon tiles in preparation for bonding to glass, single-crystal silicon wafers are ion-implanted with hydrogen to form a buried hydrogen-rich and highly defective layer below the surface of the silicon. Depending on the energy of the ion-implant, the layer can be approximately 200 nm to 2 μm below the silicon surface. The mechanical strength of the hydrogen-implanted layer is significantly lower than the mechanical strength of the silicon wafer, allowing for separation of a silicon surface layer from the underlying tile at the hydrogen-implanted layer by, for example, mechanical cleaving.

In a general application, a round silicon wafer is cut to form a square or rectangular tile in a manner designed to minimize crystalline damage to the edge of the wafers. The tiles are attached to large area glass substrates by anodic ion bonding under heat, pressure and electric field. During this process, the silicon tile is separated at the hydrogen-implanted boundary layer, leaving a thin silicon layer attached to the glass. Multiple silicon tiles can be tiled on the glass. The thin silicon tiles attached to the glass substrate after separation are polished to form a uniform and thin (e.g., about 100 nm-2 μm thick) layer. As a result of this process, a large-area (e.g., 370 mm×470 mm to 3 m×3 m) glass substrate is prepared with wafer-sized (e.g., 150 mm×150 mm to 200 mm×200 mm) thin silicon tiles bonded to the surface. Circuit elements, such as transistors and photosensitive elements, can then be fabricated using processes and manufacturing tools for large-area flat-panel displays. NMOS and PMOS transistors formed in silicon-on-glass using flat-panel-technology display carrier mobilities within a factor of two of comparable devices formed in bulk silicon, allowing the performance and level-of-integration advantages of single-crystal silicon imaging arrays with the area of flat-panel amorphous silicon imaging arrays.

However, since the thin silicon wafer bonded to the glass is of a single thickness (e.g., 100 nm-2 μm thick), the thickness is not optimal for both photosensitive elements and for transistors. The optimum thickness for transistors is on the order of from about 20 nm to about 100 nm. Thicknesses greater than 100 nm tend to yield NMOS and PMOS transistors with high leakage current. Moreover, the thickness of the silicon layer used for transistors requires very high uniformity, since transistor parameters such as threshold voltage, mobility, sub-threshold slope and leakage current are found to depend on thickness, with a thickness difference of as little as 10 nm resulting in device non-uniformity. This thickness requirement, however, is generally incompatible with thickness requirements for photosensitive elements. Absorption of even 50% of visible light requires a thicknesses of 340 nm, 950 nm and approximately 2,000 nm in the blue, green and red (e.g., 450 nm, 550 nm, 650 nm) spectra, respectively, all significantly larger than the 100 nm maximum thickness for transistors. It is desirable to construct a pixel for an imaging array in which the silicon thickness for the photosensitive element is different from the silicon thickness of the readout element.

It also would be desirable to provide a thermally grown gate dielectric for silicon-on-glass transistors. Transistors formed using flat-panel display technology typically utilize gate dielectrics deposited by plasma-enhanced chemical vapor deposition (PECVD) rather than the thermally-grown gate dielectrics used in single-crystal silicon. PECVD deposited gate dielectrics, such as the silicon nitride used for amorphous silicon transistors or the silicon dioxide used for polysilicon transistors, display higher fixed and mobile charge, lower breakdown fields, and greater non-uniformity than thermally grown gate dielectrics, such as SiO2 layers grown on silicon wafers. However, glass substrates cannot be heated to over 600 C without warpage, so thermally grown dielectrics have not been feasible to date.

Thus, there is a need in the art for an improved manufacturing method that allows for different thicknesses of semiconductor layers in a planar imaging array which provides precise control of these thicknesses. There also is a need in the art for an imaging array having semiconductor layers of different thicknesses. Finally, there is a need in the art for a thermally-grown gate dielectric in transistors formed in large-area flat-panel substrates.

SUMMARY OF THE INVENTION

The present invention remedies the foregoing needs in the art by providing an improved imaging array and an improved method of manufacturing a large-area flat-panel imaging array.

In one aspect of the invention, an imaging array includes a glass substrate, a plurality of photosensitive elements formed on the glass substrate, and a plurality of readout elements formed on the glass substrate. Each of the photosensitive elements includes a portion of a silicon tile bonded to the glass substrate, the silicon tile having a buried dielectric layer defining a bottom silicon layer on a side of the dielectric layer closest the glass substrate and a top dielectric layer on a side of the dielectric layer opposite the glass substrate.

In another aspect of the invention, a method of manufacturing an imaging array includes providing a silicon tile having a first surface and a second, opposite surface. A buried dielectric layer is formed in the silicon tile between the first and second surfaces to define a bottom silicon layer between the first surface and the dielectric layer. A separation boundary is formed in the silicon tile between the second surface and the dielectric layer to define a top silicon layer between the dielectric layer and the separation boundary and a removable silicon layer between the separation boundary and the second surface. The bottom silicon layer is attached to a glass substrate. The silicon tile is separated at the separation boundary to remove the removable silicon layer, exposing the top silicon layer. Semiconducting devices are formed in one or more of the exposed top silicon layer, the dielectric layer, and the bottom silicon layer.

These and other aspects, objects, and features of the invention may be appreciated with reference to the accompanied detailed description of the invention and figures, which describe and illustrate preferred embodiments of the present invention.

BRIEF DESCRIPTION OF THE DRAWING FIGURES

DETAILED DESCRIPTION OF THE INVENTION

As noted above, the present invention is particularly useful for large area, flat panel digital radiography imagers. Typically, such imagers are larger than about 6 inches in both the row and columnar directions. Preferably, the invention incorporates silicon on glass (SiOG) technology, in which one or more silicon tiles are bonded to a glass substrate. The silicon tiles generally are on the order of about 200 mm×200 mm and are formed from round silicon wafers that are trimmed to the desired dimensions. Generally from about 150 mm to about 450 mm in diameter. The glass substrate to which the tiles are bonded can range in size, and preferably is a standard size, for example from generation 2 glass to generation 10 glass. Once the silicon tiles are bonded to the glass substrate, they then are fabricated to form individual pixels. While in the preferred embodiments of the invention the pixels include photosensitive elements and readout elements (thus forming a radiographic detector array), the invention could be applied to large area display devices, as well. In such an application, the photosensitive element would be replaced with a display element. Similarly, each pixel could include both imaging and display elements.

Figure 1:
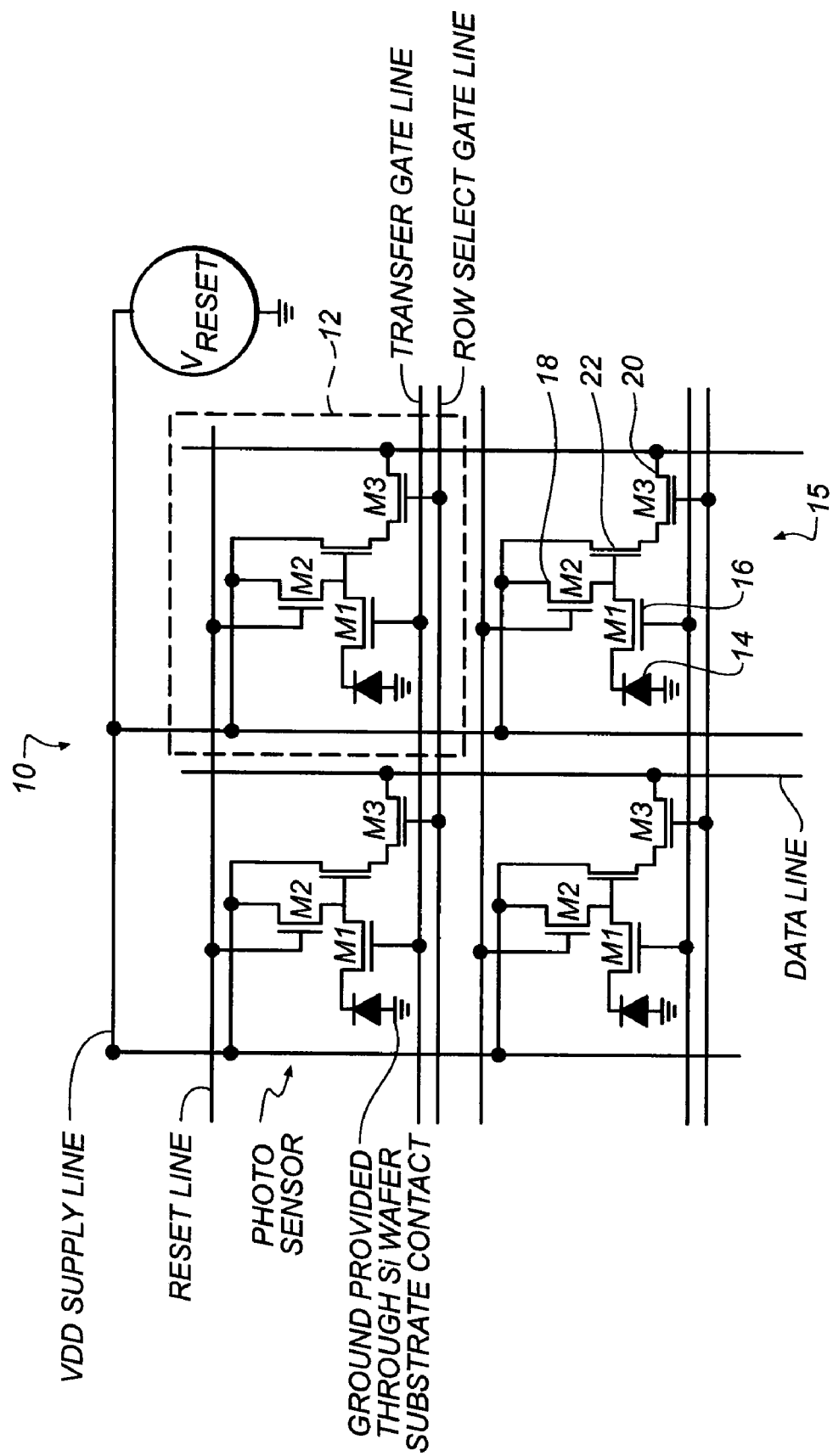
FIG. 1 is a schematic circuit diagram of a prior art imaging array including a 2×2 matrix of pixels.
Figure 2:
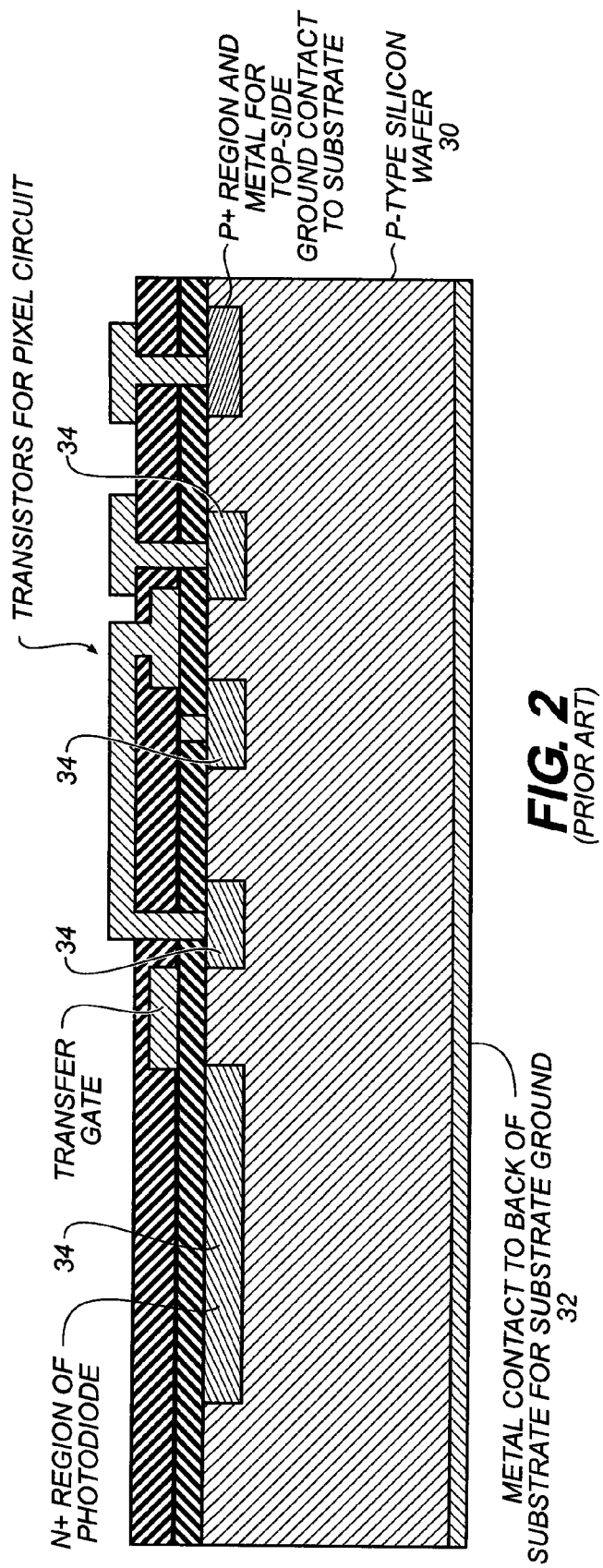
FIG. 2 is a cross-sectional elevation view of a prior art pixel used in the array illustrated schematically in FIG. 1.
Figure 3:
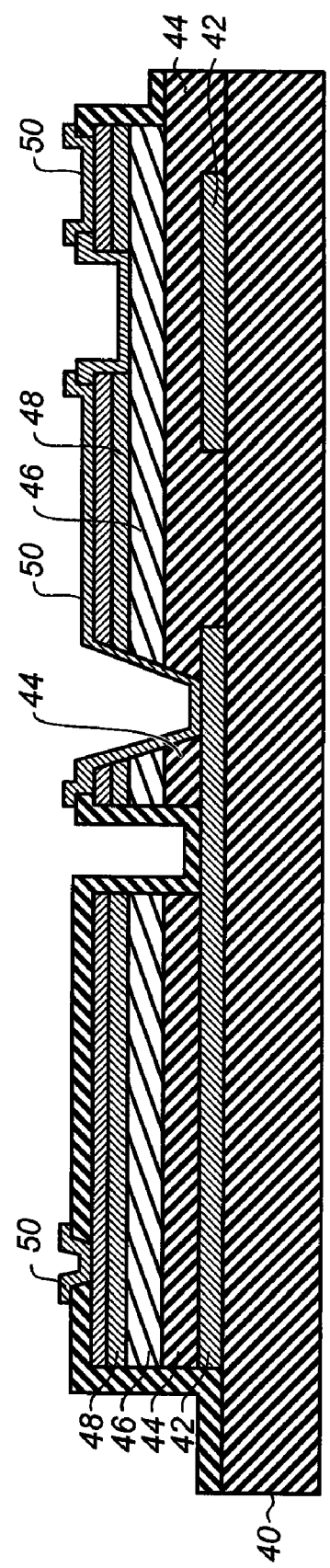
FIG. 3 is cross-sectional elevation view of another prior art pixel used in the array illustrated schematically in FIG. 1.
Figure 4:
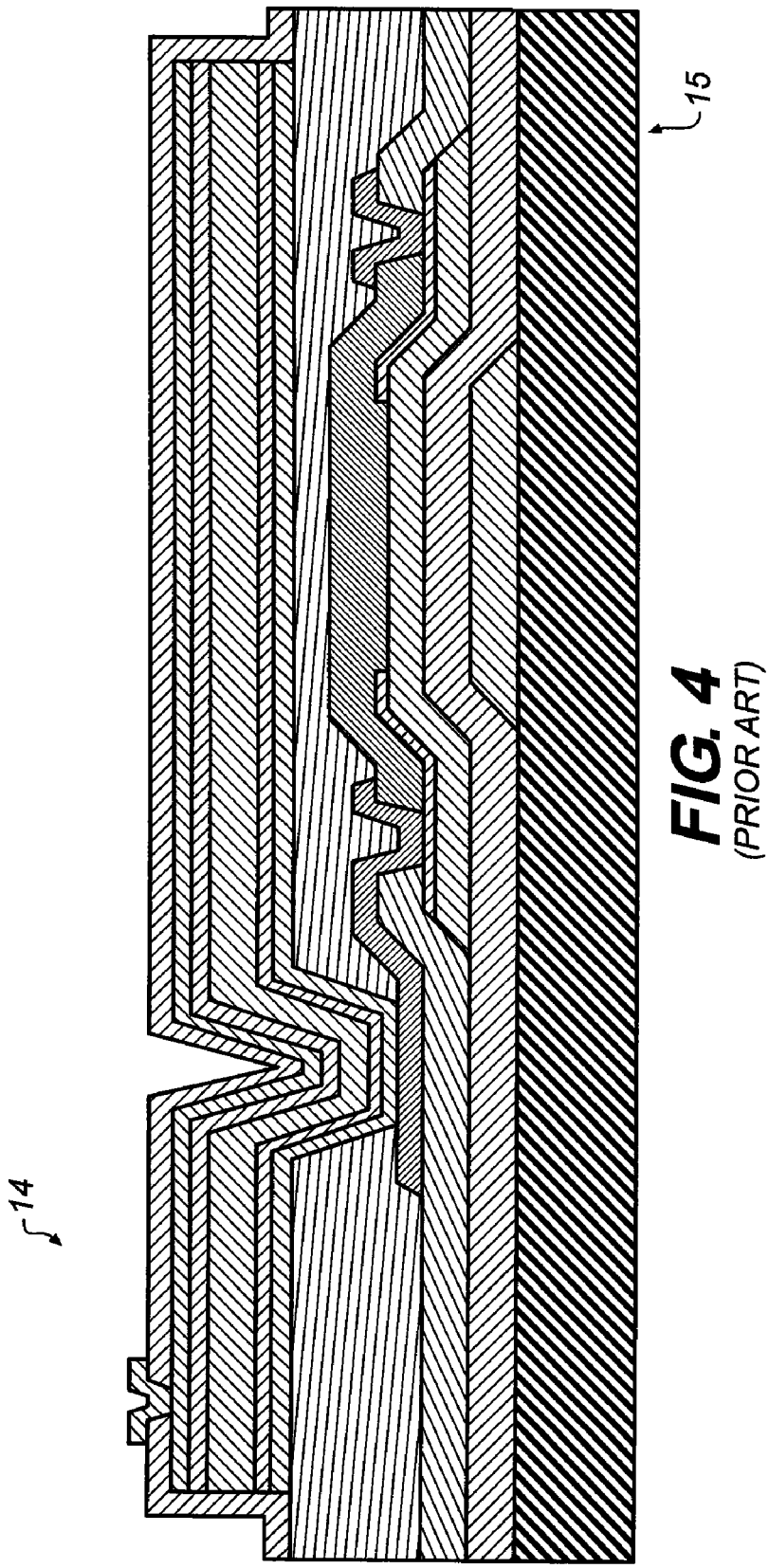
FIG. 4 is cross-sectional elevation view of another prior art pixel used in the array illustrated schematically in FIG. 1.
Figure 5:
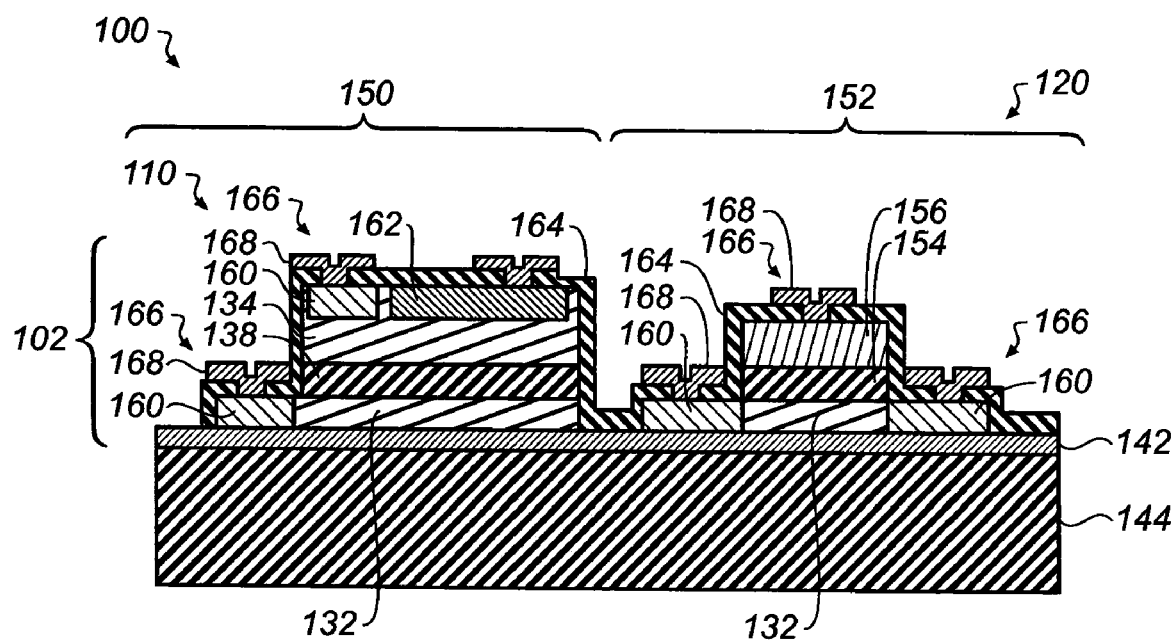
FIG. 5 is a cross-sectional elevation view of a pixel structure according to a first preferred embodiment of the invention.

A portion of an imaging array 100 according to a first embodiment of the invention is illustrated in FIG. 5. The imaging array 100 includes a pixel 102. As should be appreciated, the imaging array 100 will include a number of pixels 102, generally arranged in rows and columns, but only one pixel 102 is illustrated in FIG. 5 for clarity. The pixel 102 includes two semiconductive devices, namely, a photosensitive element 110 and a readout element 120, arranged adjacent to each other, on the same plane. The photosensitive element 110 is generally formed in a first, photosensitive element area 150 and the readout element 120 generally is formed in a second, readout element area 152. In this embodiment, the photosensitive element is a p-n junction photodiode, although, and as will be appreciated from the following description, the photosensitive element could be any number of known photosensors, including, but not limited to, MIS photosensors, P-I-N photodiodes, photo-capacitors, charge-coupled devices, pinned photodiodes, phototransistors, photoconductors, avalanche photodiodes, and charge-injection devices. The readout element 120 of this embodiment is a MOS transistor, although any number of transistors or switching diodes could be used with the invention, including, but not limited to, TFTs, diode switches, CCDs, bi-polar transistors, and field effect transistors. Moreover, the readout element 120 could include a plurality of transistors, for example, as in the arrangement of FIG. 1. Other semiconductive that could be used in the pixel including, but are not limited to, bipolar transistors, TFT's, junction photodiodes, Schottky diodes, and MIS compactors.

As illustrated, the pixel 102 is formed on an insulating substrate, which preferably is a glass substrate 144. As noted above, the glass substrate 144 can vary in area depending upon the application, to accommodate relatively larger and smaller imaging arrays. Other materials alternatively could be used for the substrate, but the invention is particularly well suited for use with a glass substrate, as will be described below in connection with the method of making the pixel 102.

A bonding layer 142 is formed on top (as oriented in FIG. 5) of the glass substrate 144. The bonding layer 142 preferably is an anodic oxide formed according to U.S. Pat. Nos. 7,176,528; 7,192,844; and 7,268,051 and is relatively thin. In particular, the bonding layer 142 preferably is from about 100 nm thick to about 1000 nm thick. Alternatively, the bonding layer 142 could be a frit bond, a solder bond, or an adhesive bonding material.

The photosensitive element 110 and the readout element 120 are disposed on the bonding layer 142. Both elements have at their base a bottom silicon layer 132. As will be described in more detail below in connection with the process for making the imaging array, the bottom silicon layer 132 in each of the photosensitive element 110 and the readout element 120 is the same layer of silicon, and thus is the same thickness for both the photosensitive element 110 and the readout element 120. Preferably, the bottom silicon layer 132 is from about 10 nm to about 200 nm thick and more preferably from about 30 nm to about 100 nm thick.

Edges of the bottom silicon layer 132 are doped. Specifically, p-type doped regions 160 are formed on the peripheral edges of the bottom silicon layer 132 in the readout element 120 and on one peripheral edge of the bottom silicon layer 132 in the photosensitive element 110. A gate dielectric 154 and a gate electrode 156 are formed on the bottom silicon layer 132 to form the readout element 120. The readout element 120 is a transistor in this embodiment. A buried dielectric layer 138 and a top silicon layer 134 are formed on the bottom silicon layer 132 to form the photosensitive element 110. The top silicon layer 134 preferably is between about 500 nm and about 4000 nm thick. The buried dielectric layer 138 is preferably silicon dioxide and has a thickness of from about 10 nm to about 100 nm. Also in the photosensitive element 110, another p-type doped region 160 and an n-type doped region 162 are formed proximate a top surface of the top silicon layer 134.

As also illustrated in FIG. 5, the pixel 102 further includes a top dielectric 164 disposed over the photosensitive element 110 and the readout element 120. Contact vias 166 are formed through the top dielectric 164 at positions to allow access to the p-type doped regions 160 and the n-type doped region 162. Contact metallization 168 is disposed in the contact vias 166 to allow electrical connection to the p- and n-type doped regions 160, 162, for example, to drive and read out the pixel 102.

Accordingly, FIG. 5 illustrates a pixel 102 for use in imaging array. The pixel 102 features a photosensitive element 110 and a readout element 120 in a side-by-side orientation on a simple substrate, but with the photosensitive element having a semiconductor region that is thicker than the semiconductor region of the readout element.

A method of fabricating the pixel of FIG. 5 now will be described with reference to FIGS. 6A-6M.

Figure 6A:
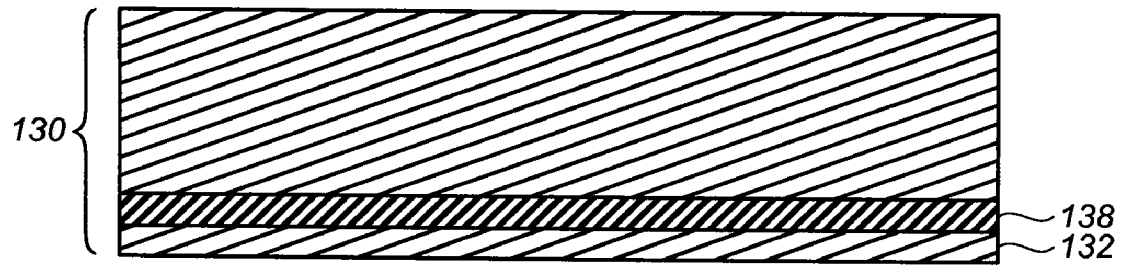
FIGS. 6A-6M illustrate the steps of a method to fabricate the pixel structure illustrated in FIG. 5.

In FIG. 6A, a single crystal silicon tile 130 of SOI silicon is provided. The silicon tile 130 preferably is rectangular or square in shape and has a buried dielectric layer 138, which preferably is a silicon dioxide layer. As noted above, the tile 130 preferably is formed by trimming a commercially available, substantially round, SOI silicon wafer. The dielectric layer 138 separates the silicon forming the tile 130 and is formed relatively closer to the bottom surface of the tile (as arranged in FIG. 6A). A relatively thin bottom silicon layer 132 is bounded by the bottom surface of the tile and the dielectric layer 138. The dielectric layer 138 preferably is from about 10 nm to about 100 nm thick, and is buried in the tile 130 such that the bottom silicon layer 132 is from about 10 nm to about 200 nm.

The buried dielectric layer 138 preferably is formed by ion-implantation of oxygen into a surface of the tile 130 and annealing at a high temperature, on the order of about 1200° C. Alternatively, two tiles (or wafers before being cut into tiles), with one or both having a dielectric formed thereon, could be bonded together to sandwich the dielectric between the two silicon tiles. In such a process, one of the two tiles is thinned using known methods, to form the relatively thinner bottom silicon layer 132.

Figure 6B:
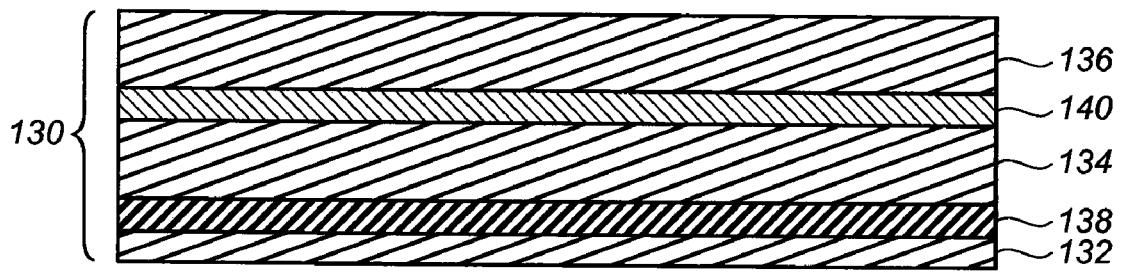

As illustrated in FIG. 6B, a hydrogen-implanted separation boundary 140 is formed in the silicon tile 130 on a side of the dielectric 138 opposite the bottom silicon layer 132. The separation boundary 140 is spaced from the buried dielectric layer 138 to define a top silicon layer 134 between the buried dielectric layer 138 and the separation boundary 140. The top silicon layer 134 preferably is from about 500 nm to about 4000 nm thick. The remaining silicon, opposite the hydrogen-implanted separation boundary 140 from the top silicon layer 134, is a removable portion of the silicon layer 136. The hydrogen-implanted separation boundary 140 preferably is formed by implanting hydrogen ions through the first surface of the silicon tile, i.e., through the bottom silicon layer 132 of the silicon tile 130 and through the dielectric layer 138.

Figure 6C:
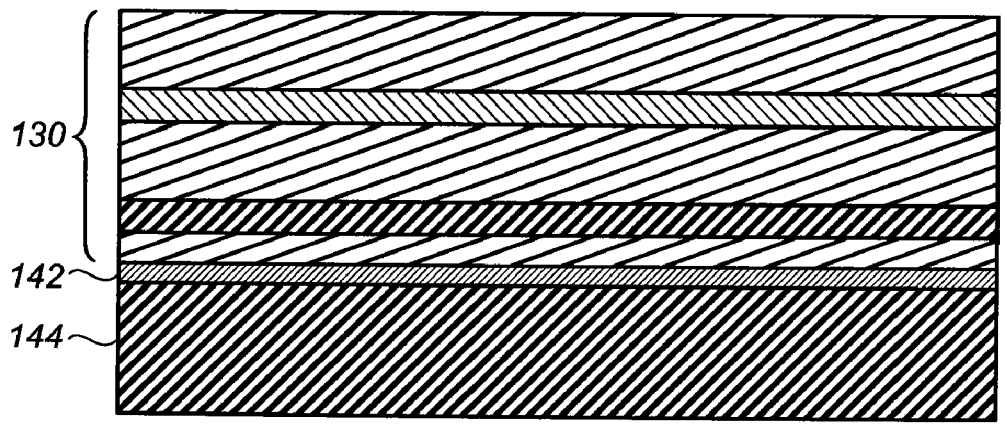

In FIG. 6C, the hydrogen-implanted silicon tile 130 is bonded, using an anodic bonding process, to the glass substrate 144. The anodic bond retains the single crystal silicon tile 130 on the glass substrate 144 by forming a bonding layer 142. Other bonding techniques, including, but not limited to, frit bonding, soldering, and adhesives could alternatively be used to bond the single crystal silicon tile 130 to the glass substrate 144. In the example in which the bonding is frit bonding, the bonding layer 142 would include particles of from about 0.1 micron to about 1.0 micron in diameter formed of glass with a lower softening temperature than the glass substrate 144. When soldering is used to attach, the bonding layer 142 would include a metal alloy having a melting temperature lower than that of the substrate 144.

Figure 6D:
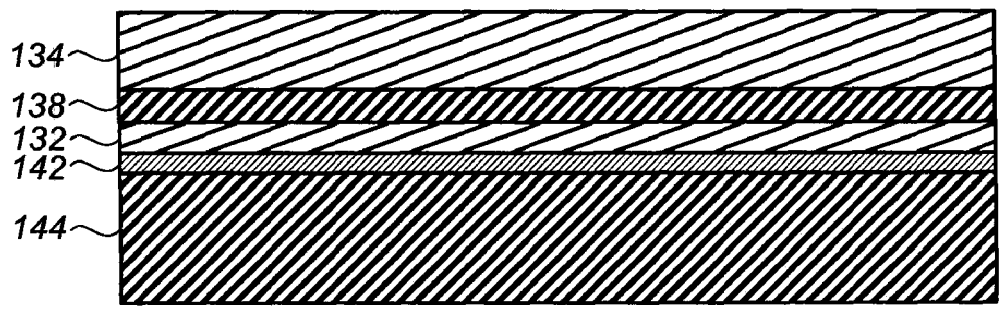

After the bonding step, or as a result of this anodic bonding process, the silicon tile 130 fractures at the depth of the ion implantation, i.e., at the separation boundary 140, as illustrated in FIG. 6D. Upon fracture, the separation boundary 140 and the removable portion of the silicon layer 136 are removed to expose the top silicon layer 134. The exposed top silicon layer 134 is polished or otherwise finished to remove crystalline damage and to create a smooth surface producing the structure shown in FIG. 6D. According to this arrangement, the top silicon layer 134 and the bottom silicon layer 132 include the same single crystal silicon, but the top silicon 134 is a higher quality silicon, because it was not used for the anodic bond to the glass substrate and thus does not include an anodic oxide layer.

Figure 6E:
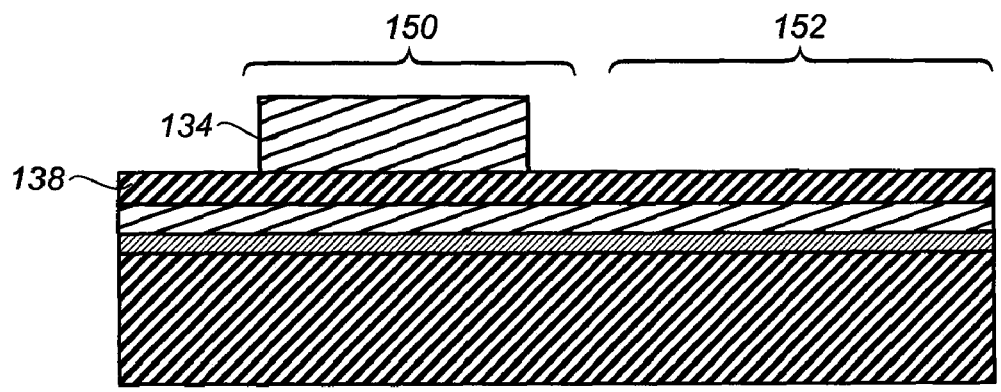
Figure 6F:
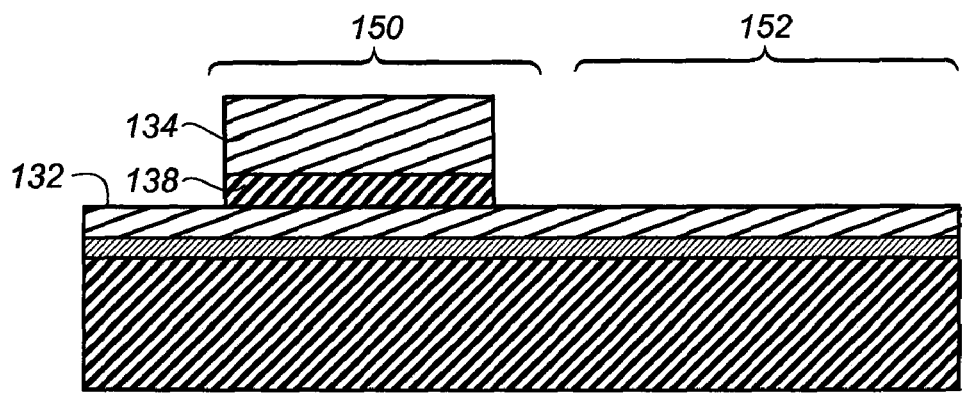

In the step illustrated in FIG. 6E, the photosensitive element area 150 and the readout element area 152 are defined generally. Specifically, using known etching techniques, the top silicon layer 134 is removed in the readout element area 152 to expose the buried dielectric 138. The etching method may include reactive ion etching (RIE), wet etching, chemical etching, or some combination of these methods. The buried dielectric layer 138 acts as an etch stop. FIG. 6F is similar to FIG. 6E, but the buried dielectric layer 138 also is removed in the readout element area 152. Specifically, using an etching process such as those listed above, the dielectric layer 138 is removed in all areas except for the portion of the photosensitive area 150 in which the top silicon layer 134 remains. Where the buried dielectric layer 138 is removed, including in the readout element area 152, the bottom silicon layer 132 is exposed.

Figure 6G:
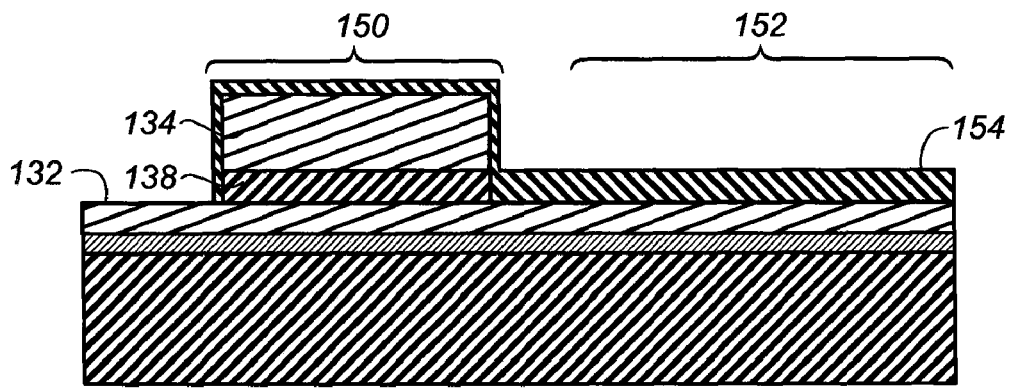
Figure 6H:
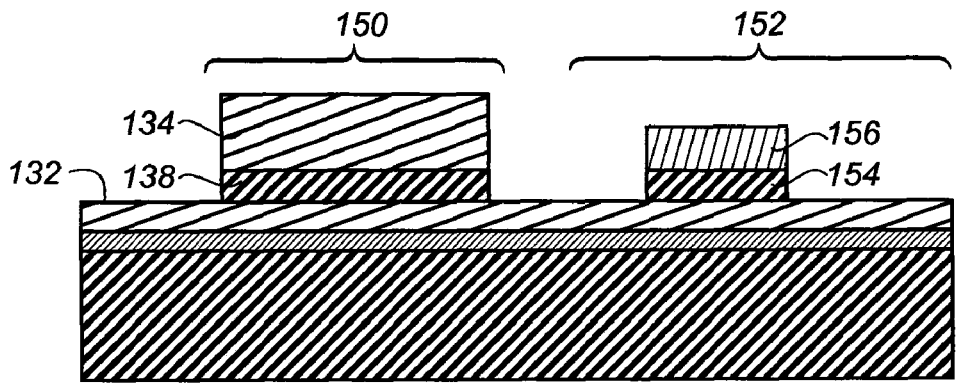

In the step illustrated in FIG. 6G, a gate dielectric 154 is formed over the exposed silicon layers 132, 134. The dielectric preferably is formed by deposition processes, such as PECVD deposition or LPCVD deposition of a $SiO_2$ layer or a $Si_3N_4$ layer. In FIG. 6H, using conventional masking and etching techniques, the gate dielectric 154 is removed except for in a portion of the readout element area 152. Also in this step, a gate electrode 156 is formed on the gate dielectric 154. In an alternative embodiment, the gate dielectric 154 may be placed selectively in the readout element area 152, instead of being deposited on and subsequently removed from, the photosensitive area 150.

Figure 6I:
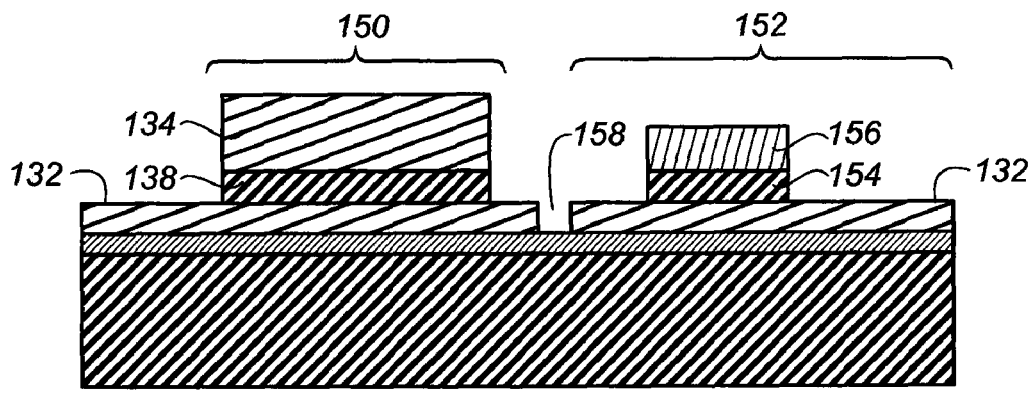

In FIG. 6I, a trench 158 is formed through the bottom silicon layer 132, to isolate the photosensitive element area 150 from the readout element area 152 above the bonding layer 142. Additional trenches 158 also would be formed to separate photosensitive element areas 150 and readout element areas 152 in adjacent pixels from each other. As illustrated, the trench is formed spaced from the gate dielectric 154 such that the bottom silicon layer 132 in the readout element area 152 has a larger surface area than the gate dielectric 154 and the gate electrode 156. Similarly, the bottom silicon layer 132 in the photosensitive element area 150 has a larger surface area than the remaining buried dielectric layer 138 and the remaining top silicon layer 134.

Figure 6J:
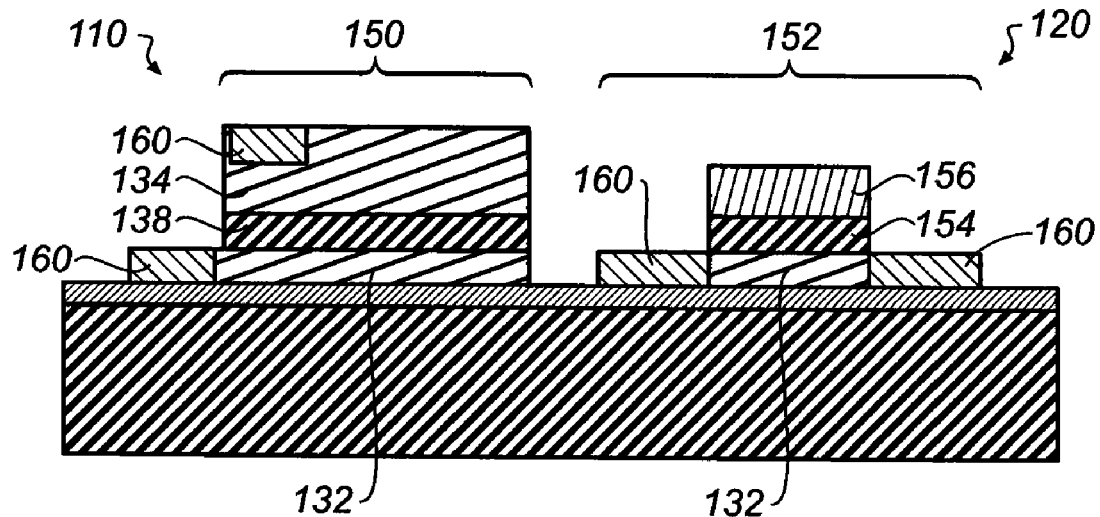
Figure 6K:
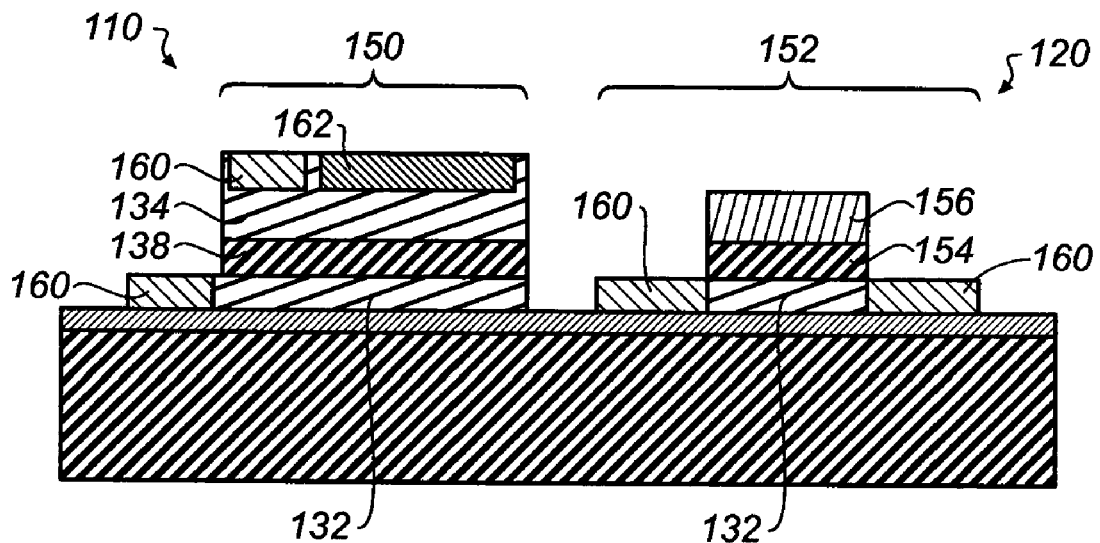

In the step illustrated in FIG. 6J, regions of the bottom silicon layer 132 in both the photosensitive element area 150 and the readout element area 152 that extend outwardly from the buried dielectric layer 138 and the gate dielectric 154 are doped to form p-type doped regions 160. A p-type doped region 160 also is formed by doping a portion of the top silicon layer 134 in the photosensitive element area 150. This doping can be performed using known methods, for example, ion shower doping or ion implantation. In addition, photoresists can be applied as necessary to ensure exposure is limited to only those areas of silicon to be doped. In FIG. 6K, additional doping is done to another portion of the top silicon layer 134 in the photosensitive element area 150, to form an n-type doped region 162. The stacked (i) bottom silicon layer 132, (ii) buried dielectric layer 138, and (iii) top silicon layer 134 with p- and n-type doped regions 160, 162, form the photosensitive element 110, which is a p-n junction photodiode. The stacked (i) bottom silicon layer 132, (ii) gate dielectric 154, and (iii) gate electrode 156 form the readout element 120. The bottom silicon layer 132 in the photosensitive element also can be used as a gate electrode, or may not be necessary to the functioning of the photosensitive element.

Figure 6L:
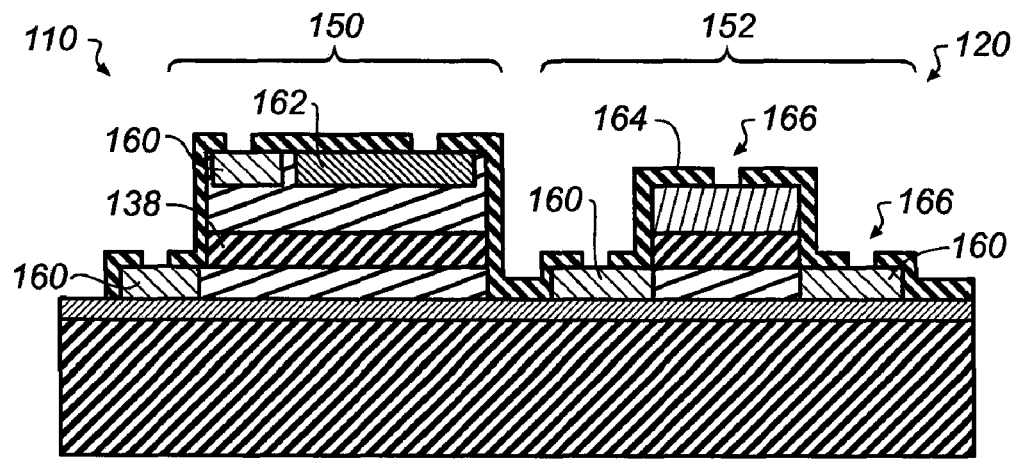

In FIG. 6L, a dielectric layer 164 is formed over the pixel 102 and contact vias 166 are formed through the dielectric layer at the gate electrode 156 of the readout element 120, the p-type doped regions 160 of the readout element 120 and the photosensitive element 110, and the n-type doped region 162 of the photosensitive element 110. The pixel 102 is completed in the step shown in FIG. 6M, which adds contact metallization 168 in the vias 166 to electrically connect to the underlying components. The contact metallization 168 may form one or both of (i) the local metallization, i.e., for electrical connection within the pixel, and (ii) the global metallization, i.e., for electrical connection between pixels and control circuitry. In the preferred embodiment, the contact metallization 168 is aluminum, although other metals may be used, including, but not limited to, molybdenum, molybdenum tungsten, chromium, or a multilayer stack including alloying of these metals.

Figure 6M:
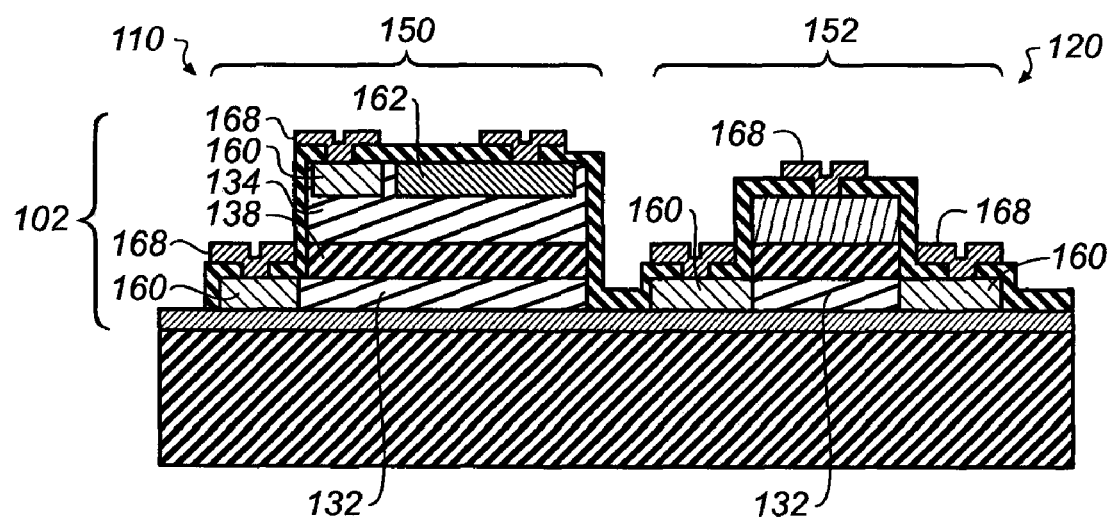

Accordingly, FIGS. 6A-6M illustrate a method of forming the pixel shown in FIG. 5; FIG. 6M is identical to FIG. 5. As will be appreciated, an imaging array is formed by creating a number of pixels on the glass substrate, in the manner described. More and more tiles can also be added to the glass substrate to provide the silicon necessary for additional pixels. The inventive method provides a low-cost, effective way to fabricate an improved pixel in which photosensors and readout elements are disposed in the same plane, but have semiconductor regions of different thicknesses. Notably, by using silicon-on-glass technology as opposed to conventional deposition techniques, the different thicknesses are readily obtained. Moreover, the use of single crystal silicon in TFTs results in carrier mobilities over 1,000 times higher than those resulting from amorphous silicon TFTs and over 50 times higher than those of LTPS. In addition, because the single-crystal silicon contains a very low density of defects or traps, the off-state leakage current between source and drain can be very low and the off-to-on switching can be accomplished with a much smaller gate-voltage swing, allowing lower voltage operation.

Another preferred method of making the pixel of FIG. 5 is similar to that shown in FIGS. 6A-6M, but alleviates the need to deposit the gate dielectric 154 on the bottom silicon layer 132. Such a method is shown in FIGS. 7A-7I. This method uses a thermally grown dielectric as the gate dielectric, which may result in a higher quality dielectric.

Figure 7A:
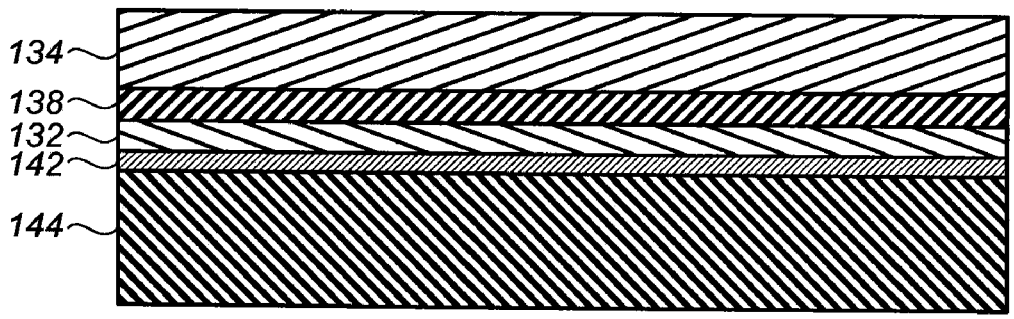
FIGS. 7A-7I illustrate the steps of another method to fabricate the pixel structure illustrated in FIG. 5.

In this alternative method of making the pixel 102 of FIG. 5, the structure shown in FIG. 7A is substantially identical to the structure shown in FIG. 6D. Specifically, the glass substrate 144 has formed thereon, in order, the bonding layer 142, the bottom silicon layer 132, the buried dielectric layer 138, and the top silicon layer 134. The illustrated structure of FIG. 7A is formed using the steps illustrated in and described in connection with FIGS. 6A-6C. Those steps are not discussed again in connection with this embodiment.

Figure 7B:
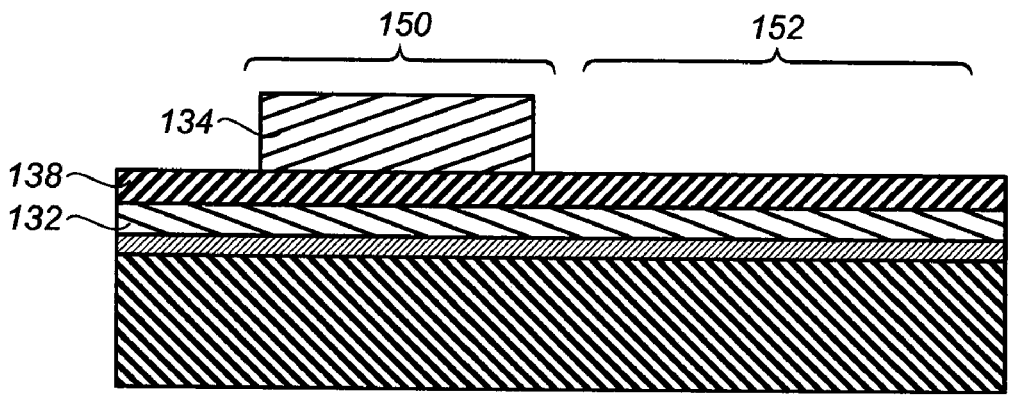

In FIG. 7B, the photosensitive element area 150 and the readout element area 152 are defined roughly by removing the top silicon region 134 in the readout element area 152. This is substantially identical to the step illustrated in FIG. 6E. The top silicon layer 134 can be removed using conventional photolithography and etching processes. The etch used to remove the silicon preferably has a high etch selectivity to the buried oxide 138, and thus stops at the buried oxide, exposing portions of the buried dielectric layer 138.

Figure 7C:
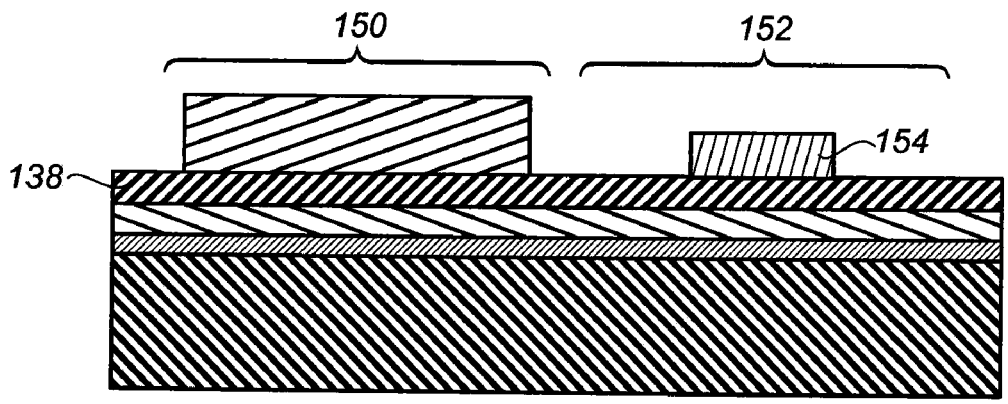
Figure 7D:
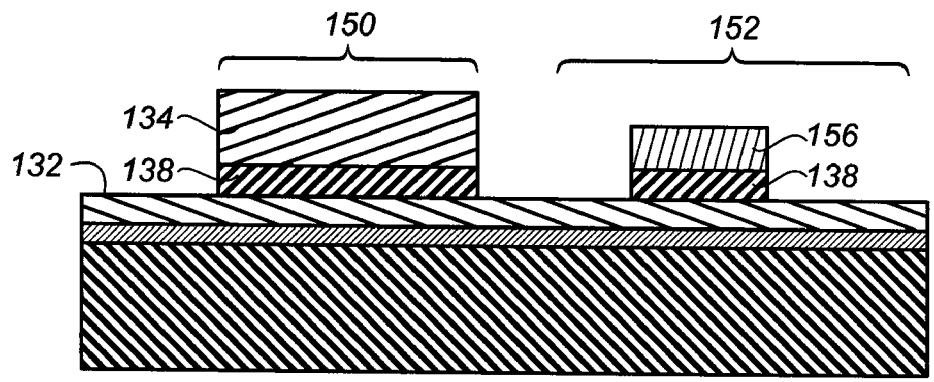
Figure 7E:
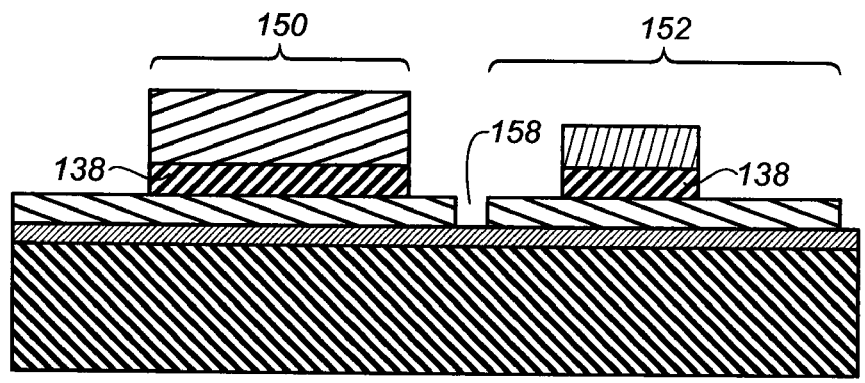

In FIG. 7C, the gate electrode 156 is deposited on the exposed portion of the buried dielectric layer 138 in the photosensitive element area 150. Notably, this step is different from the processing shown in FIGS. 6A-6M, because, instead of removing the buried dielectric layer in the readout element area 152 to expose the bottom silicon layer 132 and then depositing a gate dielectric and the gate electrode on the exposed bottom silicon layer 132, the gate electrode 156 is formed directly on the buried dielectric layer 138. Then, in FIG. 7D, the buried dielectric layer 138 is removed from areas not under the top silicon layer 134 in the photosensitive element area 150 and not under the gate electrode 156 in the readout element area 152.

Figure 7F:
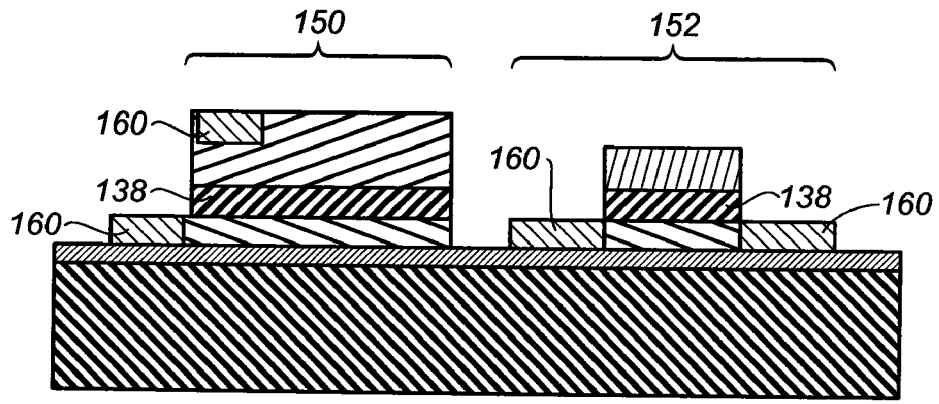
Figure 7G:
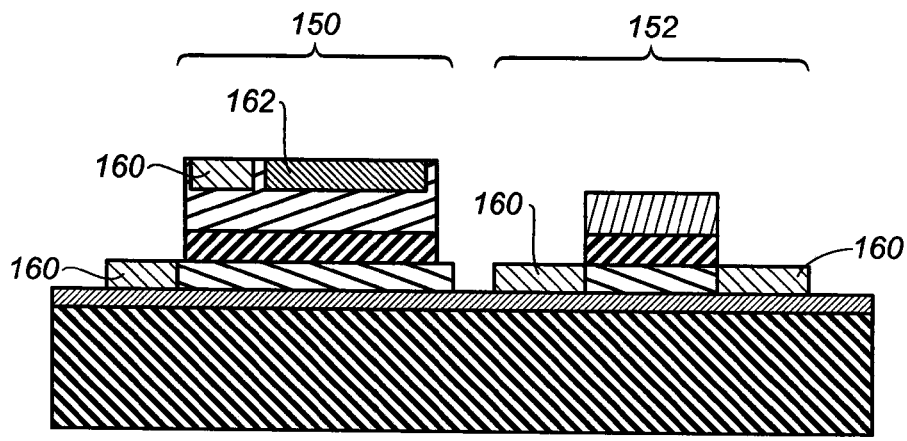
Figure 7H:
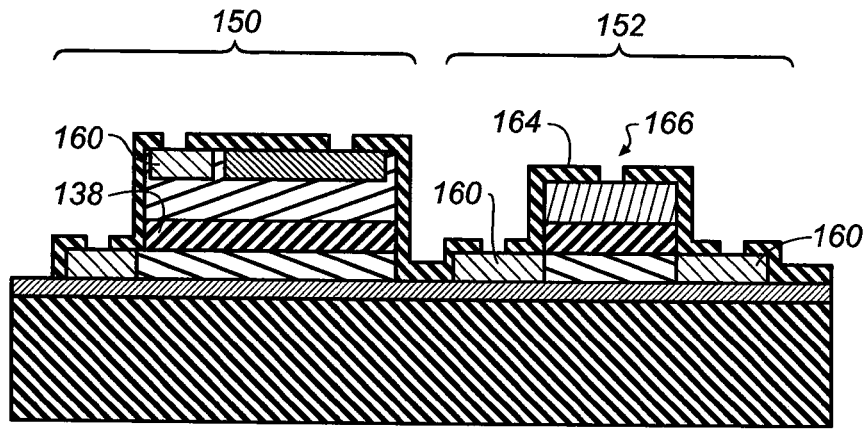

FIGS. 7E-7I are substantially identical to steps illustrated in FIGS. 6I-6M, respectively, and illustrate the remaining process steps to form the pixel shown in FIG. 5. More specifically, in FIG. 7E, the trench 158 is formed to separate the photosensitive element 110 from the readout element 120. In FIGS. 7F and 7G, the p-type doped regions 160 and n-type doped regions 162 are formed, respectively. In FIG. 7H, the top dielectric 164 is deposited over the pixel and the contact vias 166 are formed through the top dielectric 164. The contact metallization layer 168 is deposited in FIG. 7I to form electrical connections.

Figure 7I:
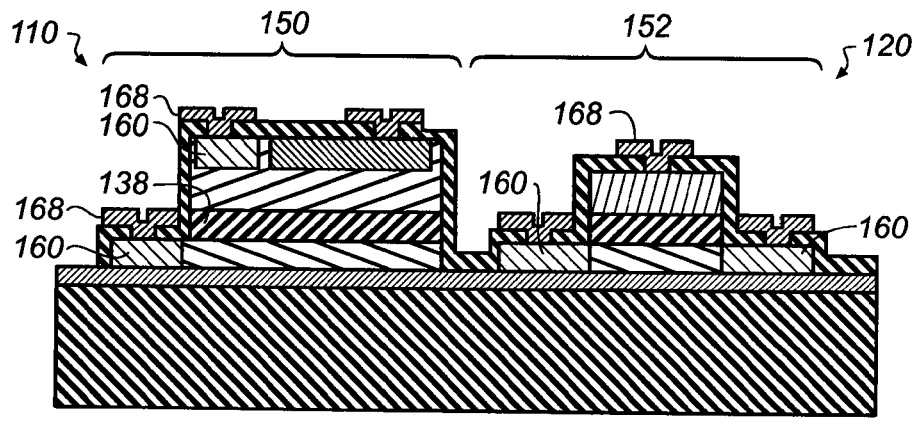

As should be understood from the foregoing, the pixel illustrated in FIG. 7I is substantially identical to the pixel illustrated in FIG. 6M, except that the gate dielectric layer is made from a different process in the pixel in FIG. 7I. Specifically, while the gate dielectric layer is formed on the bottom silicon layer in the embodiment of FIG. 6M, the gate dielectric layer is the buried dielectric layer in FIG. 7I. Thus, in the embodiment of FIG. 7I, instead of depositing the gate dielectric, the buried dielectric layer is used. Deposited oxides, because they are formed at relatively lower temperatures, have lower quality than oxides formed by thermal oxidation. Thus, when quality of the oxide is particularly important, the method shown in FIGS. 7A-7I may be more suitable than the method of FIGS. 6A-6M. In another alternative embodiment, not shown, a thermally grown oxide formed by exposing the exposed bottom silicon layer to oxygen in a furnace tube could be used to form a suitable dielectric layer for the gate dielectric, although this has the potential for warping the glass substrate.

Figure 8:
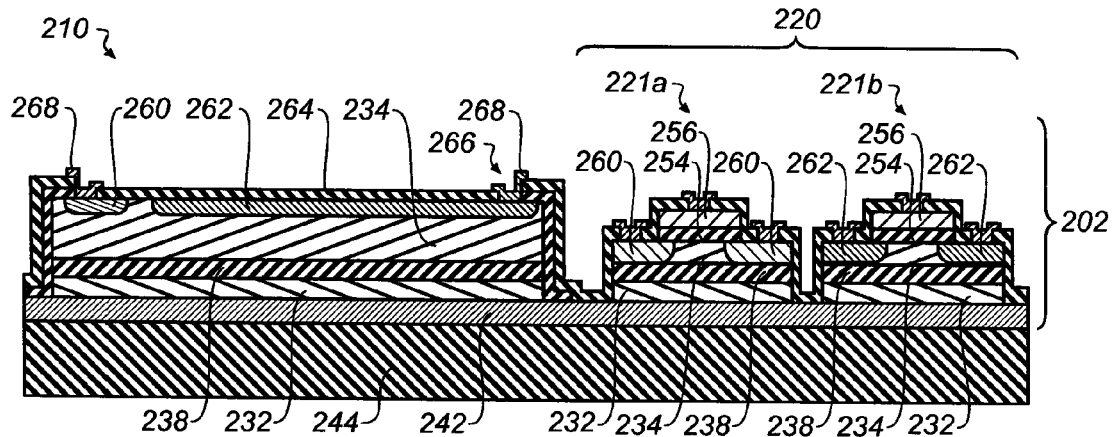
FIG. 8 is a cross-sectional elevation view of a pixel structure according to another preferred embodiment of the invention.

Another embodiment of the invention is illustrated in FIG. 8. In this embodiment, a pixel 202 according to this embodiment is similar in form and manufacture to that illustrated in foregoing embodiments. Specifically, this pixel 202 has a PIN photodiode as a photosensitive element 210 and a readout element 220. The readout element 220 includes first and second transistors 221a, 221b. (Although two transistors are shown, more or fewer transistors could alternatively be used.) The pixel 202 also has both a top silicon layer 234 and a bottom silicon layer 232 separated by a buried dielectric layer 238. The bottom silicon layer 232 is bonded to a glass substrate 244 by a bonding layer 242.

This embodiment differs from the foregoing embodiments in that it utilizes only the higher quality silicon of the top silicon layer 234 to form the photosensitive element 210 and the first and second transistors 221a, 221b. As noted above, the top layer is very high quality single crystal silicon, even when compared to the bottom silicon layer, because the bottom silicon layer is used for bonding to the glass substrate 244.

In the embodiment illustrated in FIG. 8, the top silicon layer 234 is thinned in regions in which the transistors 221a, 221b are to be formed, but the thickness is maintained in those regions in which the photosensitive elements 210 is formed. Methods of forming an array in which readout elements are formed in areas in which single crystal silicon is thinned are described in co-pending U.S. patent application Ser. No. 12/474,332, the disclosure of which is hereby incorporated by reference. When the top silicon layer 234 is thinned in regions in which the transistors 221a, 221b are to be formed, in order, a gate dielectric 254 and a gate electrode 256 are formed on the thinned silicon to form the transistors 221a, 221b. The gate dielectric 254 preferably also is disposed over the photosensitive element 210. Thereafter, a top dielectric 264 is deposited, contact vias 266 are formed through the dielectric layers 254, 264 at positions corresponding to p- and n-type doped regions 260, 262, and contact metallization 268 is provided in the contact vias 266 for electrical communication. Note that the first transistor 221a is a PMOS transistor, with p-type doped regions and the second transistor 221b is an NMOS transistor, with n-doped regions. As should be appreciated, the method of forming the pixel of FIG. 8 is similar to the method illustrated above in FIGS. 6A-6M, but a step of thinning the top silicon layer is introduced.

The invention also is not limited to the arrangements or photosensitive elements illustrated above. For example, FIGS. 9A and 9B illustrate alternative embodiments in which the photosensitive elements 310 are MIS photosensors and the readout element 320 includes two transistors 321a, 321b.

Figure 9A:
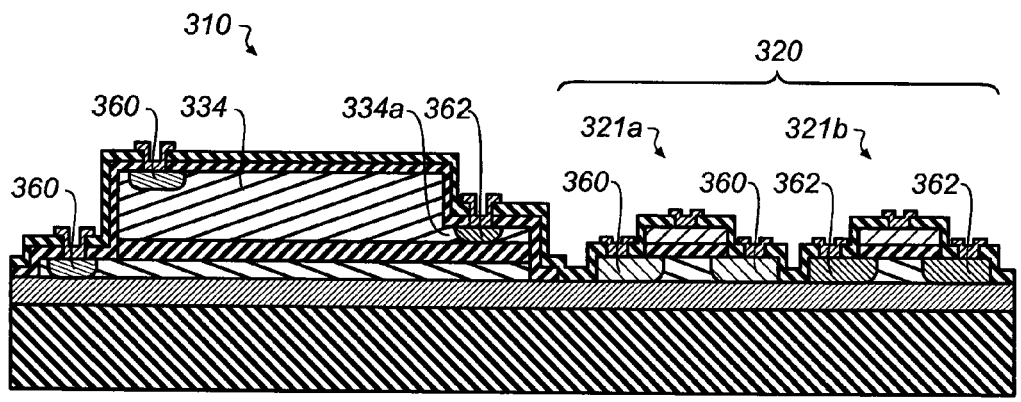
FIGS. 9A and 9B are cross-section elevation views of alternative pixel structures according to other preferred embodiments of the invention.

In FIG. 9A, like in FIG. 8, the pixel 302 is formed in a manner similar to that illustrated in FIGS. 6A-6M, but with two transistors, instead of one. Different from the previous embodiments, however, a top silicon layer 334 of the photosensitive element 310 is stepped using a conventional thinning process, resulting in a thinned silicon region 334a. The thinned silicon region 334a is doped to form an n-type doped region 362, while a portion of the relatively thicker area of the top silicon layer 334 is doped to form a p-type doped region 360. The first transistor 321a also has p-doped regions 360 forming source and drain regions and the second transistor 321b has n-doped regions 362 forming source and drain regions. The remaining elements of the pixel shown in FIG. 9A are substantially identical to those of FIG. 5 and will not be described herein in more detail.

In the embodiment of FIG. 9A, the photosensitive element 310 is an MIS photosensor. In this embodiment, a gate dielectric 354 formed in the transistors 321a, 321b also is formed over the top silicon layer 334 in the photosensitive element 310. A transparent gate electrode 357 thereafter is formed over the gate dielectric 354 in the photosensitive element 310 and a top dielectric 364 is formed over the pixel, including over the transparent gate electrode 357. In this arrangement, the top silicon layer 334 has p- and n-type doped regions 360, 362 communicating with the first and second transistors 321a, 321b.

Figure 9B:
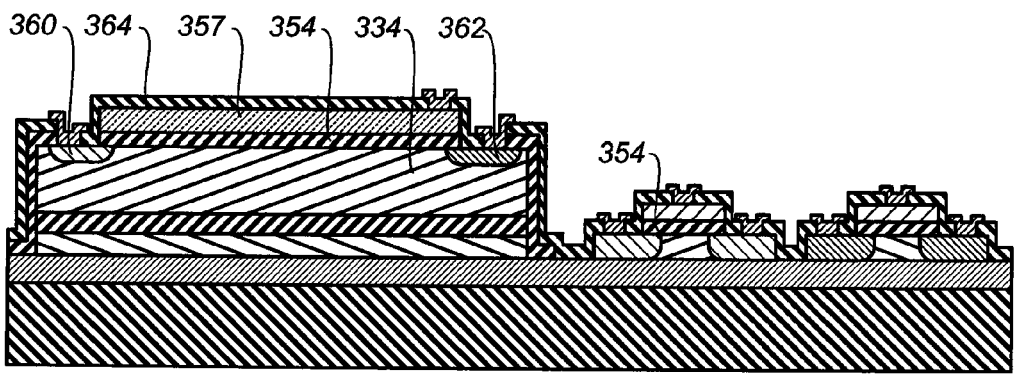

Features of the previously-described embodiments also could be incorporated into the embodiments of FIGS. 9A and 9B. For example, the gate dielectric for the readout elements could be formed from the buried dielectric, as described above in connection with FIGS. 7A-7I. In addition, the readout elements 320a, 320b could be formed in the top silicon layer 334, using the same principles described above in connection with FIG. 8.

Photosensitive elements such as those just described are fabricated in single crystal silicon according to the invention. Single-crystal silicon technology is commonly used in semiconductor microelectronics, and is frequently used to fabricate image sensors for cellular phones. Despite the fact that single crystal silicon is generally free of atomic defects that impede device performances, these imagers range in only several millimeters in physical dimension. Scaling these devices to large area of up to tens of inches in linear dimension is impractical.

Alternatively, another known imaging array uses thin-film transistors on glass. Such approach uses amorphous silicon technology that is widely used in the display industry such as LCD televisions and computer monitors. Amorphous silicon technology allows the fabrication of devices uniformly across large areas of up to tens of inches in linear dimension. However, because of the comparatively poor semiconductor quality and the need of low temperature processing of glass substrates, performances on transistors and photosensitive elements are often hindered.

Silicon-on-glass technology, as proposed herein, provides a unison solution to the benefits of both single crystal silicon grade semiconductor material, and the feasibility of uniform devices over large areas. These benefits aid in realizing high performance transistors and photosensitive elements required on a large area imaging array.

The foregoing embodiments of the invention are representative embodiments, and are provided only for illustrative purposes. The embodiments are not intended to limit the scope of the invention. Variations and modifications are apparent from a reading of the preceding description and are included within the scope of the invention. The invention is intended to be limited only by the scope of the accompanying claims.

PARTS LIST

10. Imaging array
12. Pixel(s)
14. Photosensitive element
15. Readout element
16. Transfer gate
18. Reset transistor
20. Row select transistor
22. Amplifier transistor
30. Single crystal silicon tile
32. Metal contact
34. N-doped region
40. Glass substrate
42. First level of metal
44. Gate dielectric
46. Undoped layer
48. Heavily doped N-type amorphous silicon
50. Second level of Metal
100. imaging array
102, 202, 302. pixel
110, 210, 310. photosensitive element
120, 220, 320 readout element
221a, 221b, 321a, 321b transistor
130. silicon tile
132, 232, 332. bottom silicon layer
134, 234, 334. top silicon layer
136. removable portion of the silicon layer
138, 238. buried dielectric layer
140. hydrogen-implanted separation boundary
142, 242. bonding layer
144, 244. glass substrate
150. photosensitive element area
152. readout element area
154, 254, 354. gate dielectric layer
156, 256. gate electrode
158. trench
160, 260, 360. p-type doped regions
162, 262, 362. n-type doped regions
164, 364. top dielectric
166, 266. contact vias
168. contact metallization
334a. thinned region of silicon
357. transparent gate electrode

We claim:

1. A method of manufacturing an imaging array comprising:
    providing a silicon tile having a first surface and a second, opposite surface and a dielectric layer in the silicon tile between the first and second surfaces, proximate the first surface to define a bottom silicon layer between the first surface and the dielectric layer;
    forming a separation boundary in the silicon tile between the second surface and the dielectric layer to define a top silicon layer between the dielectric layer and the separation boundary and a removable silicon layer between the separation boundary and the second surface;
    bonding the first surface of the silicon tile to an insulating substrate;
    separating the silicon tile at the separation boundary to remove the removable silicon layer, exposing the top silicon layer; and forming one or more semiconducting devices in one or more of the exposed top silicon layer, the dielectric layer and the bottom silicon layer, wherein the semiconductor devices comprise one or more photosensitive elements and one or more readout elements spaced from the one or more photosensitive elements, wherein forming the readout elements comprises removing the top silicon layer and the dielectric layer to expose the bottom silicon layer and forming the readout elements using the bottom silicon layer.

2. The method of claim 1, wherein the semiconducting devices comprise one or more of MOS transistors, bi-polar transistors, junction photodiodes, Schottky diodes, metal insulating semiconductor capacitor, charge coupled devices, and photosensitive elements.

3. The method of claim 1, wherein forming the readout elements further comprises forming on the bottom silicon layer, in order, a gate dielectric and a gate electrode.

4. The method of claim 3, further comprising removing portions of the bottom silicon layer between the photosensitive elements and the readout elements.

5. The method of claim 1, wherein one or more of the readout elements and the photosensitive elements comprise doped regions.

6. The method of claim 5, wherein the doped regions are formed on one or both of the top silicon layer and the bottom silicon layer.

7. The method of claim 6, wherein a portion of the bottom silicon layer in the photosensitive element area is doped.

8. The method of claim 1, further comprising separating the photosensitive elements from the readout elements by removing portions of the top silicon layer, the dielectric layer and the bottom silicon layer between the photosensitive elements and the readout elements.

9. The method of claim 1, wherein the photosensitive elements and the readout elements are formed in the top silicon layer.

10. The method of claim 9, wherein the method of forming the readout elements comprises thinning portions of the top silicon layer.

11. The method of claim 10, wherein the readout elements are formed at the thinned portions of the top silicon layer.

12. The method of claim 10, wherein the top silicon layer is thinned to a thickness of from about 10 nm to about 200 nm.

13. The method of claim 1, wherein the photosensitive element is one of a p-n junction photodiode, a p-i-n junction photodiode, an MIS photosensor, a phototransistor, a charge coupled device, a charge injection device, a photoconductor, a pinned photodiode, and an avalanche photodiode.

14. The method of claim 1 wherein the top silicon layer is between about 500 nm and about 4000 nm thick.

15. The method of claim 1 wherein the bottom silicon layer is between about 10 nm and about 200 nm.

16. The method of claim 1, wherein the separation boundary is formed by hydrogen ion implantation.

17. The method of claim 1, wherein the silicon tile is bonded by anodic bonding to the insulating substrate.

18. The method of claim 1, wherein the insulating substrate is a glass substrate.

19. A method of forming an imaging array comprising:
providing a silicon tile having a buried dielectric layer, the buried dielectric layer being formed proximate a first surface of the silicon tile to define a bottom silicon layer between the first surface and the dielectric layer;
forming a separation boundary layer by implanting hydrogen ions into the first surface of the silicon layer to define a top silicon layer between the dielectric layer and the separation boundary layer;
bonding the first surface of the silicon tile to a glass substrate;
separating the silicon tile at the separation boundary layer to expose the top silicon layer;
removing portions of the top silicon layer to define first regions in which the top silicon layer exists and second regions in which the top silicon layer has been removed; and
forming photosensitive elements at the first regions and forming readout elements at the second regions, wherein forming readout elements comprises removing the dielectric and the bottom silicon layer in the second regions to expose the bottom silicon layer and forming, in order, a gate dielectric and a gate electrode on the exposed bottom silicon layer.

20. The method of claim 19, further comprising doping portions of at least one of the bottom silicon layer and the top silicon layer.

21. The method of claim 19, further comprising forming trenches through the bottom silicon layer to separate the first regions from the second regions.

* * * * *